United States Patent [19]

Briggs

[11] Patent Number: 5,325,041
[45] Date of Patent: Jun. 28, 1994

[54] AUTOMATIC RECHARGEABLE BATTERY MONITORING SYSTEM

[76] Inventor: James B. Briggs, 3370 San Fernando Rd., Los Angeles, Calif. 90065

[21] Appl. No.: 6,683

[22] Filed: Jan. 21, 1993

Related U.S. Application Data

[63] Continuation of Ser. No. 933,889, Aug. 21, 1992, abandoned, which is a continuation of Ser. No. 743,147, Aug. 9, 1991, abandoned.

[51] Int. Cl.$^5$ .................. H02J 7/04; G01N 27/416
[52] U.S. Cl. ............................. 320/44; 320/48; 324/429; 324/430; 340/636
[58] Field of Search ............... 320/43, 44, 45, 48; 324/429, 430, 427, 428; 340/636

[56] References Cited

U.S. PATENT DOCUMENTS

| | | | |
|---|---|---|---|
| 4,246,529 | 1/1981 | Jurgens et al. | 320/39 |
| 4,387,334 | 6/1983 | Loper | 320/44 |
| 4,484,130 | 11/1984 | Lowndes et al. | 320/40 |
| 4,677,363 | 6/1987 | Kopmann | 320/44 |
| 4,775,827 | 10/1988 | Ijntema et al. | 320/44 |
| 4,820,966 | 4/1989 | Fridman | 320/37 |
| 5,012,176 | 4/1991 | LaForge | 320/31 |
| 5,043,651 | 8/1991 | Tamura | 320/43 |

Primary Examiner—Steven L. Stephan
Assistant Examiner—Adolf Berhane
Attorney, Agent, or Firm—Lyon & Lyon

[57] ABSTRACT

An electronic device for monitoring the charge state of a rechargeable battery comprising a voltage sensor, a current sensor, a microprocessor, and a display. The voltage sensor is operatively connected to the microprocessor to provide to the microprocessor an electronic signal indicative of the voltage appearing across the terminals of the battery. The current sensor is operatively connected to the microprocessor to provide to the microprocessor an electronic signal indicative of the current between the terminals of the battery. Based on the signals received from the voltage and current sensors, the microprocessor calculates the total current discharge capacity of the battery and the present level of charge contained within the battery, and delivers electronic signals indicative of the total current discharge capacity and the present level of charge contained within the battery to the display means.

2 Claims, 4 Drawing Sheets

AUTOMATIC RECHARGEABLE BATTERY MONITORING SYSTEM

This is a continuation of co-pending application Ser. No. 07/933,889, filed on Aug. 21, 1992 now abandoned and which designated the U.S., which is a continuation of co-pending application Ser. No. 07/743,147, filed on Aug. 9, 1991 now abandoned and which designated the U.S.

BACKGROUND OF THE INVENTION

The invention relates generally to battery monitoring systems, and in particular, to systems for monitoring the charge state of rechargeable batteries, and especially rechargeable nickel-cadmium (Nicad) batteries.

The voltage appearing across the terminals of a Nicad battery varies only slightly as the battery discharges from its maximum charge capacity to roughly 10% of that capacity. Because of this and because a Nicad battery may be recharged with relative ease, the Nicad battery has become the preferred power source for portable electronic devices utilizing both digital and analog technology. The almost exclusive use of Nicad batteries as power sources by the portable computer and cellular telephone industries illustrates this preference.

However, despite this broad preference, the utilization of Nicad batteries by the portable electronics industry raises a significant concern. Because the voltage appearing across the terminals of a Nicad battery varies only slightly until just before the battery reaches full discharge, the battery's remaining charge capacity cannot be measured accurately by traditional methods (i.e. by monitoring the voltage between the battery terminals). In fact, the voltage between the battery terminals may only be used to provide the user of a device employing the battery minimal notice of an imminent power failure resulting from full battery discharge. For this reason, portable computers and cellular telephones generally include a low battery indicator which notifies a user when the voltage across the battery terminals reaches a prescribed level. This feature allows the user to store any important information or terminate a call prior to a loss of power. However, the feature provides the user little assurance initially that the device will work for any significant amount of time.

Further, the problems resulting from the inability to estimate a Nicad battery's remaining life or charge capacity by traditional methods are augmented by a second characteristic which these batteries exhibit. When Nicad batteries are repeatedly partially discharged and then recharged, the batteries exhibit a "memory effect." In essence, the full charge capacity of the batteries deteriorates to the capacity of actual use. Thus, if the user of a device powered by a Nicad battery repeatedly fails to fully discharge the battery prior to recharging it, the useful capacity of the battery will deteriorate to the extent of actual use. This effect leaves the user in a precarious position. If the user fails to recharge the battery prior to its full discharge, the user runs the risk of having insufficient power the next time the device is used. If, on the other hand, the user charges the battery prior to its full discharge, the user runs the risk of decreasing the useful life of the battery.

It follows that the portable electronics industry would find a device for monitoring and providing an accurate indication of the charge state of a Nicad battery to be quite desireable.

SUMMARY OF THE INVENTION

The present invention is directed to a device and method which provide an accurate indication of the charge state of a rechargeable battery. Specifically, the present invention is directed to a device which continuously monitors the total current discharge capacity, as well as the remaining charge capacity of a rechargeable battery. To this end, an exemplary embodiment of the present invention employs a current sensor, a voltage sensor, a microprocessor, and a display. The current sensor and the voltage sensor are connected to the terminals of a rechargeable battery. The current sensor is operatively coupled to the microprocessor thereby enabling the microprocessor to monitor the magnitude and direction of any current passing through the battery terminals, and the voltage sensor is operatively coupled to the microprocessor enabling it to monitor the voltage appearing across the battery terminals. Based on the signals received from the current and voltage sensors, the microprocessor repeatedly calculates the total discharge capacity of the battery and the present level of charge contained within the battery. Further, the microprocessor provides to the display electronic signals indicative of the total battery discharge capacity and the relationship between the present level of stored charge and the nominal rated battery discharge capacity. It also keeps a record of the total number of discharge cycles of the battery. Thus, the user of a device employing an embodiment of the present invention can accurately predict the charge capacity or remaining life of a battery powering the device.

In another aspect, the present invention is directed to a method for monitoring and accurately indicating the charge state of a rechargeable battery. Specifically, an exemplary method comprises the steps of (1) sampling the current flowing into and out of a battery at repeated intervals; (2) sampling the voltage appearing across the terminals of the battery to identify when the voltage achieves predetermined levels; (3) integrating the sampled current values over time to determine the total current discharge capacity of the battery (i.e. integrating current from a time of full charge to a time of total discharge); (4) repeating the steps of current sampling and integration to calculate a present level of charge contained within the battery (i.e. integrating either from a period of full charge to present or from a period of total discharge to present); (5) comparing the present level of charge within the battery to the nominal rated discharge capacity of the battery, (6) counting and displaying the number of discharge cycles of the battery, (7) controlling and scaling the display such that it indicate "0" at a fully (or almost) discharged condition and indicates a value not greater than the present total discharge capacity of the battery when at a fully charged condition, (8) continuously calibrating and maintaining a value for the present total discharge capacity of the battery (as in step (3)), so that this information may be displayed, including the effects of battery temperature and aging, and (9) providing an output from the microprocessor which may be used to control a battery charger in order to achieve the most effective battery charging characteristics.

In still another aspect, the present invention is directed to a rechargeable battery meter which disconnects an external load from a battery when the charge state of the battery reaches a prescribed level. By disconnecting the external load, the battery meter minimizes the risk that the circuit components of which the battery monitor is comprised will suffer a memory loss stemming from a total loss of power. In addition, by disconnecting the external load the battery meter prevents the battery from discharging excessively or charging in reverse, two actions which greatly reduce battery life.

Accordingly, it is an object of the present invention to provide an improved device and method for monitoring the charge state of a rechargeable battery.

DESCRIPTION OF THE PREFERRED EMBODIMENT

Figure 1:
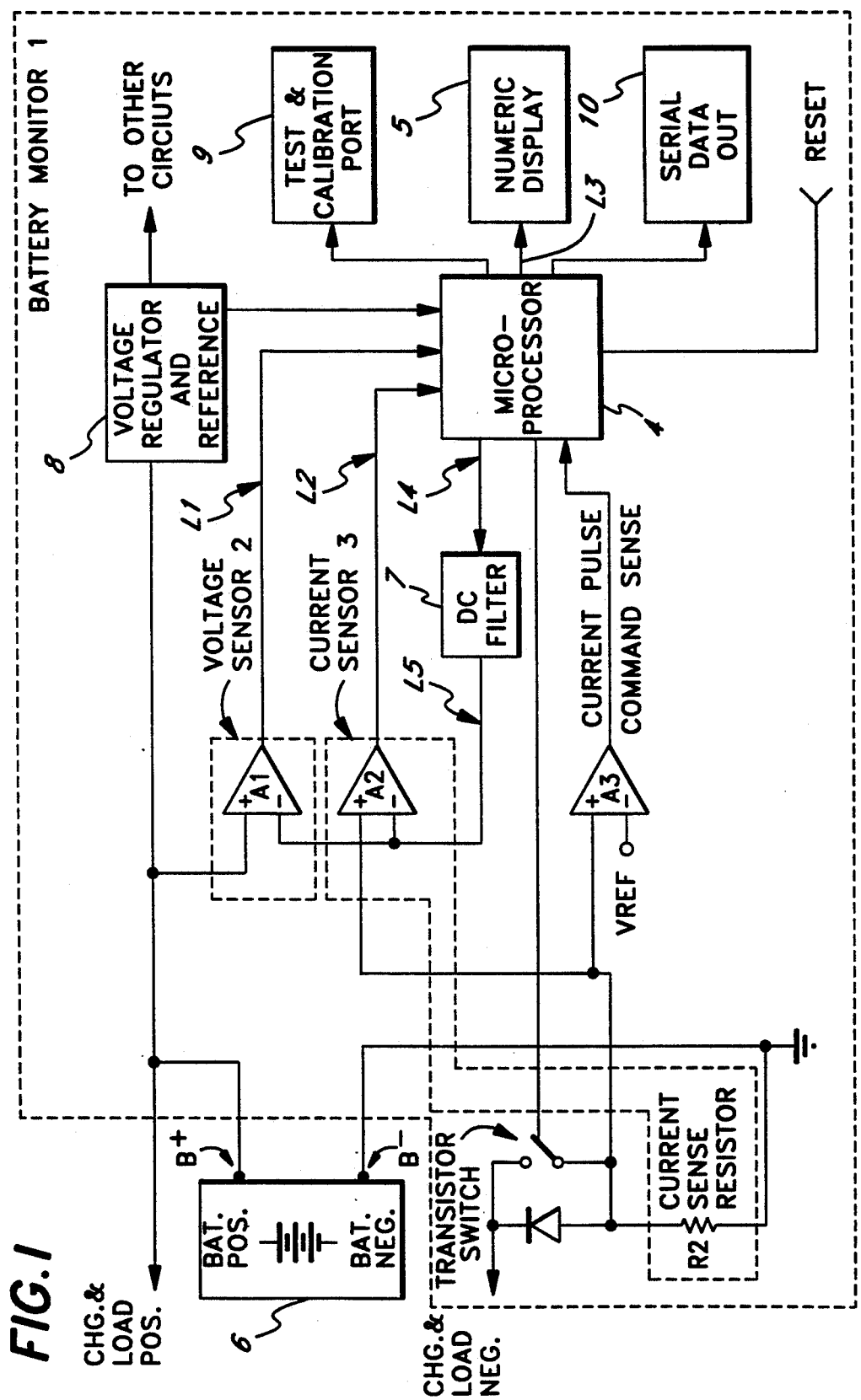
FIG. 1 is a schematic block diagram illustrating a battery monitor embodying the present invention.

Turning to the drawings, FIG. 1 is a schematic block diagram of a battery monitor 1 in accordance with a preferred form of the invention. The battery monitor 1 comprises a voltage sensor 2, a current sensor 3, a microprocessor 4, and a display 5. The voltage sensor z and the current sensor 3 are connected to the terminals of the battery 6, such that the voltage sensor 2 monitors the voltage appearing at the positive terminal B+ of the battery 6, and the current sensor 3 monitors the magnitude and direction of the current flowing through the negative terminal B— of the battery 6. In addition, the voltage sensor 2 is operatively coupled to the microprocessor 4 such that the voltage sensor 2 provides to the microprocessor 4 an electronic signal on line L1 indicative of the voltage across the terminals B+ and B— of the battery 6. The current sensor 3 is operatively coupled to the microprocessor 4 such that the current sensor 3 provides to the microprocessor 4 an electronic signal on line L2 indicative of the magnitude and direction of any current through the negative terminal B— of the battery 6. Based on the signals received from the current and voltage sensors, the microprocessor 4 calculates and stores the total current discharge capacity of the battery 6, it determines the present level of charge contained within the battery 6, and it provides to the display 5 electronic signals on line L3 indicative of the relationship between the present level of charge stored in the battery and the nominal rated discharge capacity of the battery 6, the total discharge capacity of the battery, or the total number of discharge cycles. The display 5, preferably a liquid crystal display (LCD), provides a display indicating the remaining life of the battery 6 in the form of either a percentage of nominal rated discharge capacity or a numeric representation of milliamp hours (mAh) remaining.

In a preferred form, the microprocessor 4 comprises a permanent memory (ROM) containing a stored program, a volatile memory (RAM) for storing variables and performing calculations, an arithmetic unit, a timer counter, a clock oscillator, and various input and output ports. As is well known to those skilled in the art, microprocessors of this type may be purchased readily from distributors of semiconductor devices. For example, the microprocessor 4 illustrated in FIG. 2 may be a microprocessor of the type commonly sold by Motorola as model 68HC05C4FN.

Figure 2A:
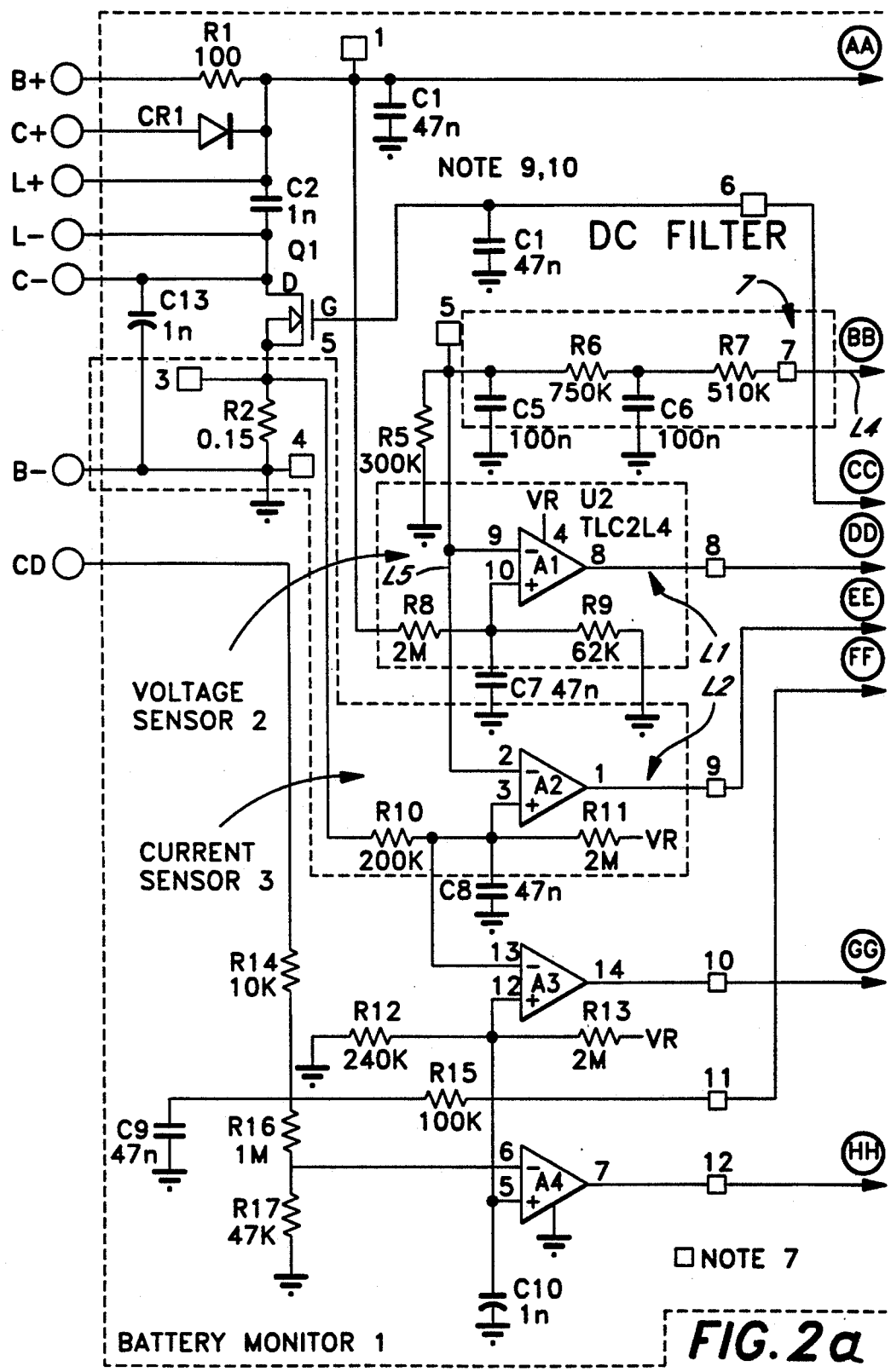
FIG. 2(a) is a first portion of a circuit diagram illustrating a preferred embodiment of the invention.
Figure 2B:
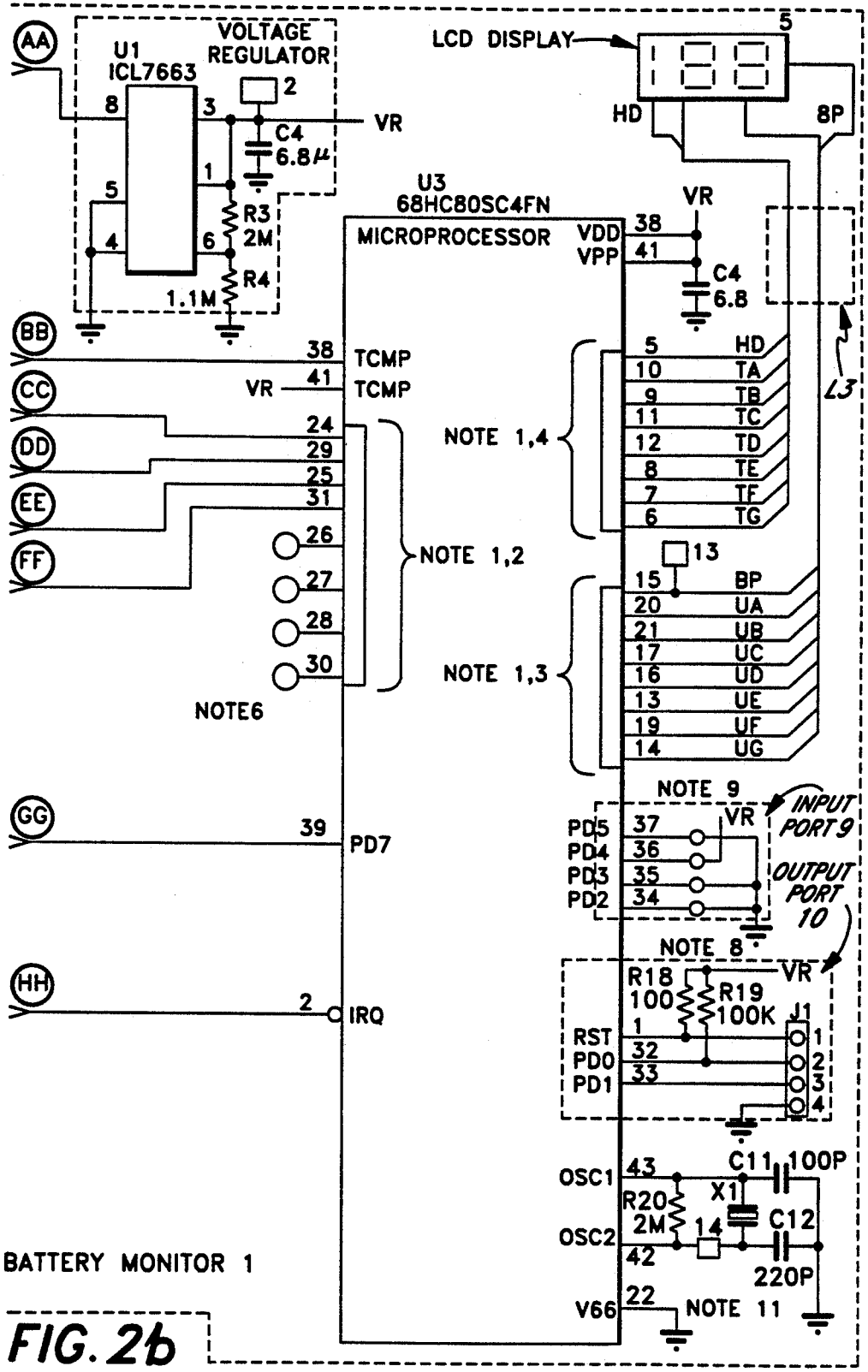
FIG. 2(b) is a second portion of a circuit diagram illustrating a preferred embodiment of the invention.

Referring now to FIGS. 1, 2(a) and 2(b), the voltage sensor 2 comprises a first operational amplifier A1 and a voltage divider comprising resistors R8 and R9. The current sensor 3 comprises a second operational amplifier A2, a current sensing resistor R2, and a second voltage divider comprising resistors R10 and R11. Both operational amplifiers A1 and A2 act as voltage comparators, and both interact with the microprocessor 4 to provide to the microprocessor 4 electronic signals indicative of the operating parameters of an associated battery 6.

To evaluate the voltage appearing across the terminals B+ and B— of the battery 6, the microprocessor 4 generates and stores a digital number representative of battery voltage within its memory. Next, the microprocessor 4 generates and delivers on line L4 a digital signal having a duty cycle proportional to the stored voltage value to a DC filter 7. The DC filter 7, comprising resistors R6 and R7 and capacitors C5 and C6, converts the digital waveform to an analog signal (a DC voltage proportional to the duty cycle of the digital waveform) and delivers the resulting analog signal on line L5 to one input (A1, pin 9) of the voltage sensing operational amplifier A1. The other input (A1, pin 10) of the voltage sensing operational amplifier is connected to the voltage divider comprising resistors R8 and R9, which supplies a voltage proportional to the voltage appearing across the terminals B+ and B— of the battery 6 to the input (A1, pin 10). Thus, the voltage sensing operational amplifier A1 compares a voltage proportional to the digital number stored within the microprocessor 4 (the filtered voltage) to a voltage proportional to the voltage appearing across the terminals B+ and B— of the battery 6 (the measured voltage). If the filtered voltage exceeds the measured voltage, the output of the voltage sensing operational amplifier 2 will shift to a low state and cause the microprocessor 4 to reduce the digital number controlling the duty cycle of the waveform emitted to the DC filter 7 by a single unit. If the measured voltage exceeds the filtered voltage, the output of the voltage sensing operational amplifier 2 will shift to a high state and cause the microprocessor 4 to increase the digital number controlling the duty cycle of the waveform emitted to the DC filter 7 by a single unit. Thus, as the microprocessor 4 continuously updates the digital number representing battery voltage stored within its memory, the digital number will achieve a value proportional to the voltage appearing across the terminals B+ and B— of the battery 6.

To evaluate the current through the negative terminal B— of the battery 6, the microprocessor 4 performs a similar process. As before, the microprocessor 4 generates and stores a digital number within its volatile memory. However, in this case the number stored in the memory of the microprocessor represents the magnitude and direction of the current through the negative terminal B— of the battery 6 at a given instant. Next, the microprocessor 4 delivers to the DC filter 7 a digital signal having a duty cycle proportional to the stored number. The DC filter 7 converts the digital signal to an analog signal (the filtered voltage) and delivers the filtered voltage to one input (A2, pin 2) of the current sensing operational amplifier Az. The other input (A2, pin 3) of the current sensing operational amplifier A2 is connected to a second voltage divider comprising resistors R10 and R11 which supplies a voltage proportional to the voltage appearing across the current sensing resistor R2 to the input (A2, pin 3). Because the current sensing resistor R2 generates a voltage proportional to the current flowing through the negative terminal B− of the battery 6, the microprocessor 4 compares the filtered voltage to a voltage which is proportional to the current flowing through the negative terminal B− of the battery 6. Thus, as the microprocessor 4 continuously updates the incremental current value stored within its memory, that value will achieve a value proportional to the magnitude of the current through the current sensing resistor R2, and the sign of the resulting incremental current value will indicate the direction of the current through the current sensing resistor R2.

Because in the preferred form the microprocessor 4 utilizes the same DC filter 7 to evaluate both battery voltage and current, the microprocessor 4 performs the voltage and current evaluation functions sequentially, each time storing a new current or voltage value in memory.

To determine the charge state of the battery 6, the microprocessor performs a series of calculations over time based on the stored values representing battery voltage and current. The calculations performed by the microprocessor 4 allow the microprocessor 4 to continuously track the total current discharge capacity of the battery 6, the present level of charge contained within the battery 6, and, finally, the total number of discharge cycles of the battery 6. The following example illustrates the calculations performed by the microprocessor 4.

When a battery is purchased, the total current discharge capacity of the battery will generally correspond to the specific rating which the battery has been assigned (e.g. 500 milliamp hours). Thus, when a new battery rated for 500 milliamp hours has been charged sufficiently to reach its full charge capacity, the battery should have a capacity of 500 milliamp hours or more. If the battery is then discharged at current $I_d$, the current $I_d$ may be integrated over time to determine the amount of charge (measured in milliamp hours) expelled by the battery. It follows that, if the battery is discharged until it reaches a point of full discharge, the value of the integration of the current $I_d$, the actual amount of current discharge, should equal or exceed the nominal capacity of the battery. Similarly, if a new battery is charged from a point of full discharge at current $I_c$, when the value of the integration of the current $I_c$ over the corresponding time period equals the nominal capacity of the battery (assuming 100% charging efficiency), the battery should be at its full charge capacity. Because the actual total current discharge capacity may be determined according to the present invention as discussed above, the level of charge contained within the battery also may be determined according to the invention at any time by comparing the value of the integrated current to the nominal rated current discharge capacity of the battery. Further, the level of charge contained within the battery may be expressed to a user of a device powered by the battery in the form of either milliamp hours available or a percentage of battery capacity.

Figure 3:
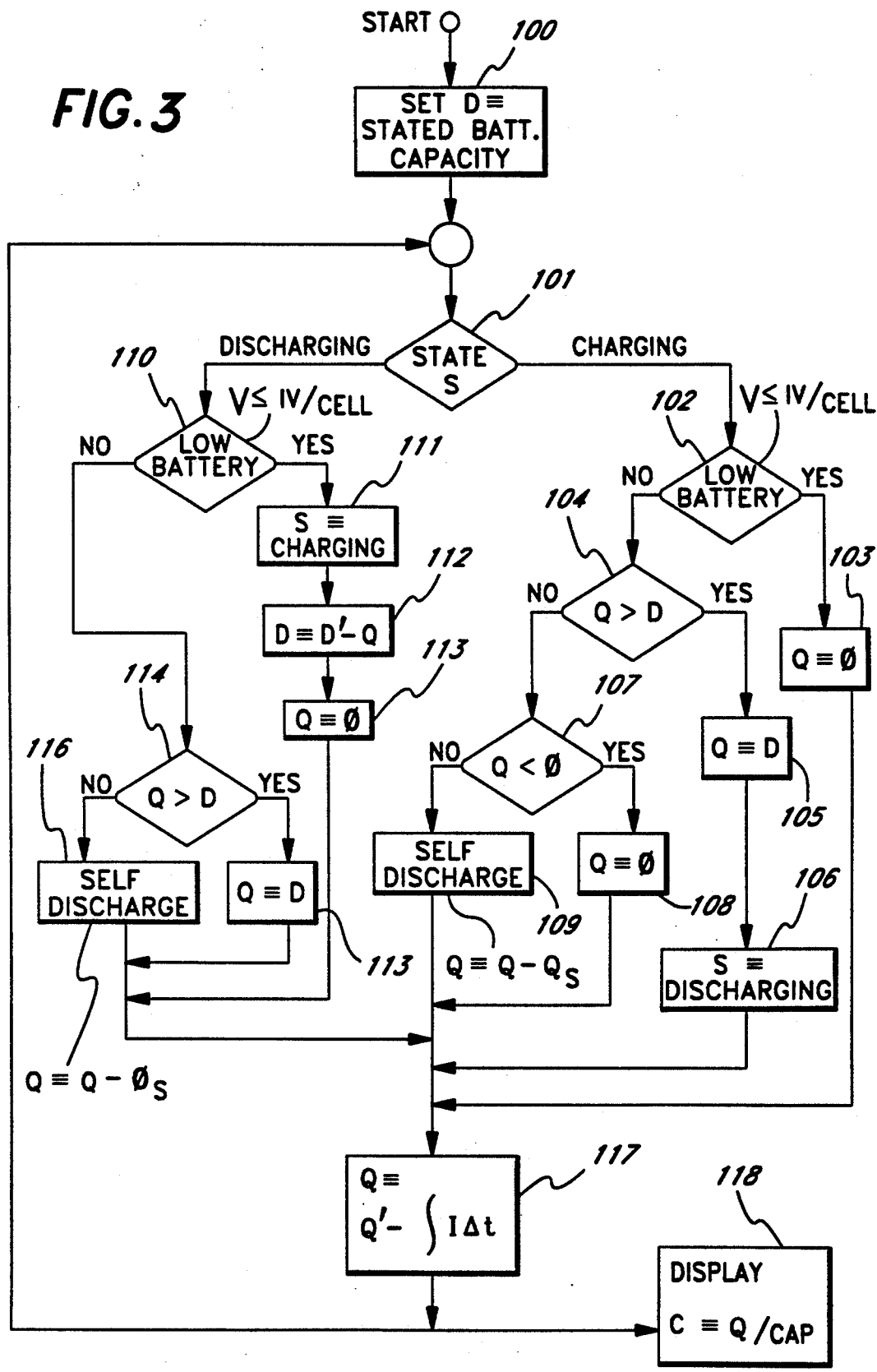
FIG. 3 is a flow chart illustrating the present method and the functions performed by a microprocessor in conjunction with a preferred embodiment of the invention.

Referring now to the flow chart of FIG. 3, the microprocessor 4 manipulates six variables stored within its volatile memory (RAM) to determine the displayed charge state C (step 118) of the battery 6. These variables comprise the values representing battery voltage v and incremental current I discussed above, a value representing the charge accounting state S (the state of the charge accounting system, charging or discharging), a value representing the total discharge capacity D (or maximum measured capacity) of the battery 6, a charge value Q representing an integration of the current I flowing into and out of the battery 6 (and thus the present charge capacity), and a displayed value C representing the displayed charge capacity of the battery 6. The term CAP represents the rated charge capacity.

Initially (step 100), the microprocessor 4 sets the value of the total current discharge capacity D equal to a predetermined value, usually the stated capacity of the battery 6. The microprocessor 4 then determines the charge accounting state S (step 101), based on a previously stored value of the variable representing battery state S or in the case of the initial cycle based on a predetermined value.

If the state variable S is charging, the microprocessor 4 determines whether the voltage across the terminals of the battery 6 exceeds a predetermined value representing full battery discharge, usually 1.0 volt per cell (step 102). If the battery voltage does not exceed the predetermined value, the microprocessor 4 sets a value Q representing the integration of current I equal to 0 (step 103). If the battery voltage does exceed the predetermined value, the microprocessor 4 compares the value Q of the integration of current I to the battery's total discharge capacity D (step 104). If the value Q of the integration of current I exceeds the total discharge capacity D of the battery 6, the microprocessor sets the value Q of the integration of current I equal to the total discharge capacity D of the battery 6 (step 105). The microprocessor 4 will then set the value of the variable representing charge accounting state S equal to a value representing discharge (step 106). If the value Q of the integration of the current I does not exceed the total battery discharge capacity D, the microprocessor 4 will determine whether the value representing the integration of current exceeds 0 (step 107). If the value Q representing the integration of current I does not exceed 0, the microprocessor 4 will set the value Q of the integration of current I equal to 0 (step 108). Finally, if the value Q of the integration of current I exceeds 0, the microprocessor will subtract a predetermined charge valve, Qs, representing self-discharge loss due to chemical losses within the battery from the value Q representing the integration of current I, and store the resulting number as the new value Q representing the integration of current I (step 109). It should be noted that in a preferred form the program controlling the microprocessor 4 also provides the capability to adjust the value representing the incremental current flow I by a predetermined charging efficiency factor (e.g., some number less than 1, such as 0.92). This allows the microprocessor 4 to account for energy lost in the form of heat dissipation while the battery 6 is charging, and thus increases the accuracy of the battery monitor 1.

If the state variable S is discharging (step 101) rather than charging as discussed above, the microprocessor will again determine whether the voltage appearing across the terminals of the battery 6 exceeds a predetermined value representing full battery discharge (step 110). If the battery voltage does not exceed the predetermined value, the microprocessor 4 will set the value of the variable representing charge accounting state S to the charging state (step 111). At this time, the microprocessor 4 will then calculate the difference between the previously stored total battery discharge capacity D' and the present value of Q, and set the new value representing the total discharge capacity D equal to the resulting value (step 112). Then, the microprocessor 4 will set the value of Q equal to 0 (step 113). If the battery voltage exceeds the predetermined value representing full battery discharge, the microprocessor 4 will compare the value Q representing the integration of current I to the total battery discharge capacity D (step 114). If the value Q representing the integration of current I exceeds the total battery discharge capacity D, such as occurs, for example, when the battery is put on extended charge, or when only a partial charge is needed, the microprocessor will set the value Q representing the integration of current I equal to the total battery discharge capacity D (step 115). Last, if the value representing the integration of current I does not exceed the total battery discharge capacity D, the microprocessor will subtract a predetermined charge value Qs representing self discharge loss (as in previously discussed step 109) due to chemical losses within the battery from the value Q representing the integration of current flow I, and store the resulting number as the new value Q representing the integration of current 1 (step 116).

Finally, prior to completing each cycle the microprocessor 4 will divide the value representing the integration of current flow Q by the total battery discharge capacity D and store the resulting value representing the charge state C of the battery 6 within its volatile memory (step 117) and provide a display thereof (step 118).

It follows that the user of a device employing an embodiment of the battery monitor discussed above may readily obtain an indication of the total discharge capacity of the battery 6 in milliamp hours and, more importantly, an indication of the charge remaining in the battery 6 either in the form of a percentage of total capacity or in milliamp hours. Further, in a preferred form the battery monitor 1 will provide the user an indication of the number of charge cycles which the battery 6 has undergone. To accomplish this task the microprocessor 4 need only calculate the number of times that the battery voltage reaches a prescribed level or the number of times the charge state of the battery reaches a prescribed level.

Referring again to FIGS. 1, 2(a) and 2(b), in a preferred form, the microprocessor 4 of the battery monitor 1 also controls a transistor switch Q1 capable of disconnecting the battery 6 from an external load (not shown). For example, the microprocessor 4, upon detecting that the battery voltage has dropped below a predetermined value, usually 0.8 volts per cell, will emit a digital signal to the transistor switch Q1 causing the transistor switch Q1 to stop the flow of current to the external load. By disconnecting the external load from the battery 6 the microprocessor 4 minimizes the risk that the battery meter 1 will suffer a power loss. This feature obviates the need to include a backup battery or EEPROM within the battery monitor 1.

In another form, the battery monitor 1 comprises a voltage regulator 8 (FIGS. 1 and 2(b)), which provides a precise, stabilized reference voltage to all of the circuit components comprising the battery monitor 1. Specifically, utilization of the voltage regulator s minimizes any variation in circuit function which might be attributable to variations in the power supply voltage. The use of voltage regulators is generally known in the art, and voltage regulators of the type illustrated may be readily purchased through distributors of semiconductor devices. For example, the voltage regulator 8 of FIG. 2(b) comprises model ICL7663 sold by Intersil.

In still another form, the battery monitor 1 provides a serial data input port 9 and output port 10 (FIGS. 1 and 2(b)). The input port 9 (pins PD2-5) may be used to test, calibrate, or program the microprocessor 4, and the output port 10 (pins pD0,pD1, and RST) may be used to provide information to an external device such as an independent battery charger or display means.

In still another form, the battery monitor 1 can control the information delivered from the microprocessor 4 to the display 5. For example, the microprocessor 4 can be instructed to alter the indication of remaining battery life from a percentage value to a numeric value denoting milliamp hours (mAh) remaining. Further, the microprocessor 4 can be instructed to indicate the number of charge cycles which the battery has undergone or to indicate the battery's present total discharge capacity. As shown in FIGS. 1 and 2(a), a third operational amplifier A3 is employed to control the mode of display. In this case, the third operational amplifier A3, upon sensing an increase in the flow of battery current to the external load, causes the microprocessor 4 to cycle the display through its various modes. It should be noted, however, that the same operation could be accomplished through the use of a switch (not shown).

In still another form, the battery monitor 1 can reset the microprocessor to its initially programmed values. To this end, the microprocessor 4 comprises a fourth operational amplifier A4 (FIG. 2(a)) having an external input CD. When the terminal CD is shorted to the battery voltage, the operational amplifier A4 resets the microprocessor 4 circuits to their initial operating parameters. This feature allows the microprocessor 4 to be reset with minimal effort in the case of a total power loss or in the case of any other event causing memory loss to the microprocessor.

While the invention is susceptible to various modifications and alternative forms, specific examples thereof have been shown by way of example in the drawings and are herein described in detail. It should be understood, however, that it is not intended to limit the invention to the particular forms disclosed, but on the contrary, the invention is to cover all modifications, equivalents, and alternatives falling within the spirit and scope of the invention as defined by the appended claims.

What is claimed is:

1. A method for monitoring and indicating the charge state of a rechargeable battery, said method comprising the steps of:
   sampling current into and out of said battery at repeated intervals,
   sampling a voltage across a pair of terminals of said battery to sense when said voltage reaches a predetermined level,
   integrating the sampled current from a charge value to a discharge value,
   repeating the steps of current sampling and current integration, and calculating a present level of battery charge from either a full charged state to a present charge state or a fully discharged state to said present state,
   calculating a total discharge capacity of said battery based on said integration each time said battery reaches said fully discharged state, such that said total discharge capacity comprises an approximation of a true total discharge capacity of said battery, comparing said present level of battery charge to said calculated total discharge capacity, and displaying said present level of battery charge as a function of said total discharge capacity.

2. The method of claim 1 further including the step of subtracting a predetermined charge value from said integration of said current to compensate for a self discharge effect of said battery.

* * * * *